United States Patent
Cearley-Cabbiness

[11] Patent Number: 5,322,446
[45] Date of Patent: Jun. 21, 1994

[54] TOP LOAD SOCKET AND CARRIER

[75] Inventor: Carol L. Cearley-Cabbiness, Austin, Tex.

[73] Assignee: Minnesota Mining and Manufacturing Company, St. Paul, Minn.

[21] Appl. No.: 45,589

[22] Filed: Apr. 9, 1993

[51] Int. Cl.[5] .......................................... H01R 13/00
[52] U.S. Cl. ....................................................... 439/73
[58] Field of Search .................................. 439/68-73, 439/329

[56] References Cited

U.S. PATENT DOCUMENTS

| | | | |
|---|---|---|---|
| 4,340,266 | 7/1982 | Grovender | 439/71 |
| 4,351,580 | 9/1982 | Kirkman et al. | 439/71 |
| 4,395,084 | 7/1983 | Conrad | 339/75 |
| 4,554,505 | 11/1985 | Zachry | 324/158 |
| 4,669,796 | 6/1987 | Caarter | 439/71 |
| 4,692,790 | 9/1987 | Oyamada | 357/79 |
| 4,744,009 | 5/1988 | Grabbe et al. | 361/398 |
| 4,783,719 | 11/1988 | Jamison et al. | 361/398 |
| 4,846,703 | 7/1989 | Matsuoka et al. | 439/71 |
| 4,859,189 | 8/1989 | Petersen et al. | 439/66 |
| 4,949,159 | 8/1990 | Petry, Jr. et al. | 357/70 |
| 4,969,828 | 11/1990 | Bright et al. | 439/68 |
| 5,010,038 | 4/1991 | Fox et al. | 437/215 |
| 5,158,467 | 10/1992 | Grabbe et al. | 439/71 |
| 5,161,984 | 11/1992 | Taaylor et al. | 439/73 |
| 5,167,326 | 12/1992 | Murphy | 206/331 |

FOREIGN PATENT DOCUMENTS

| | | | |
|---|---|---|---|
| 6276273 | 6/1985 | Japan | H01R 33/76 |
| 6276274 | 6/1985 | Japan | H01R 33/76 |
| 3-34279 | 1/1989 | Japan | H01R 33/76 |
| 2-309579 | 1/1989 | Japan | H01R 33/76 |
| 2169154B | 11/1985 | United Kingdom | H01R 9/09 |

*Primary Examiner*—Joseph H. McGlynn
*Attorney, Agent, or Firm*—Gary L. Griswold; Walter N. Kirn; John C. Barnes

[57] ABSTRACT

A top-load test and burn-in socket, for use with IC devices having a plurality of contact terminals located in a predetermined pattern on a surface of said device, adapted for automation has a base supporting a plurality of contacts, a flexible film having a conductive wiring pattern formed thereon, and an elastomeric support having a size and shape to support said first set of conductive pads with the flexible film being folded about said elastomeric support. A movable cover and a pair of cams afford the retraction of springs which press the IC device against the film along opposite ends.

14 Claims, 6 Drawing Sheets

TOP LOAD SOCKET AND CARRIER

BACKGROUND OF THE INVENTION

1. Field of the Invention

Present invention relates to a socket for connection of electronic integrated circuit devices to a circuit and in one aspect to a top load socket for test and burn-in of bare dice and a carrier for supporting the bare die.

2. Description of the Prior Art

Integrated circuit devices (bare die or leadless IC chips) are finding wide spread use in the electronic industry and before they are bonded to a circuit the same are tested to determine whether the IC die is functional and that the electrical continuity is present between the various pads on the die. To do this, the die are placed in a carrier and the carrier is placed into a test fixture for test and burn-in of the die.

Top load sockets for IC devices are known where the device is provided with leads for making electrical connection to the contacts in the socket. One example of such a socket is U.S. Pat. No. 4,993,955. Direct contact between the pins of the socket and the leads on the IC device are made.

IC devices which are leadless, or formed with mere terminations in the form of buttons or pads, are otherwise positioned and connected to the test circuit. As illustrated in U.S. Pat. No. 4,859,189 and U.S. Pat. No. 4,783,719, a resilient member presses a flexible circuit tape into contact with the pads on a surface of the IC device or die and electrical contact is made. In U.S. Pat. No. 4,783,719, the device 60 is supported in a top plate 30 which is forced into engagement with one surface of a flexible tape 50. Flexible tape is supported on the base 20 which is mounted on a printed circuit board. The top plate 30 is placed above the support 20 and spring clips 23a and 23b are pivotally mounted on the support 20 and positioned for movement over the top edge surface of the top plate 30. The springs then snap into grooves on the top plate 30 to secure the assembly with the IC pads in engagement with raised beads 52 on the flexible tape, which beads are joined to connector lines 55 of the flexible tape. The invention is well suited for the testing of leadless chip carriers, but may be employed to make solderless touch connections to other electrical devices, such as integrated circuit dice, printed wiring boards and the like.

The devices of the existing systems are not well suited to automation for the test and burn-in of thousands of IC dice. That is, the type of carriers disclosed in either of the later mentioned patents are not suited to automation. A socket for receiving a die placed in a carrier which carrier can then be robotically loaded into the socket is preferable.

The present invention provides a socket structure wherein the IC die having peripheral and/or area disposed patterns of connecting pads can be loaded into a novel carrier for automatic placement and removal from a socket. The construction of the socket allows for ease of insertion and removal automatically. The socket construction affords good electrical contact between the IC pads and an external circuit, which may be afforded by a flexible tape supported by a resilient pad. The carrier is easily loaded automatically in a manner conventional for leaded IC devices.

SUMMARY OF THE INVENTION

The present invention relates to a top-load socket for use with IC devices having a plurality of contact terminals located in a predetermined pattern on a surface of the device. The socket comprises a base which supports means for making electrical contact to a printed circuit board, a carrier, adapted to be received on the base, which supports the IC device such that the device will be positioned in opposed relationship to make electrical contact with the electrical contact means when the carrier is on the base. A cover, positioned generally parallel to and slidable supported on the base, has a central opening to receive and align the carrier and die with the base. Members interconnected between the cover and the base afford means for engaging the carrier to force the carrier and an IC device against the means for making electrical contact to place the terminals of the device in electrical contact with the external circuit when the cover is positioned away from the base, and for disengaging the carrier and device from the circuit when the cover is moved toward and positioned adjacent to the base.

The means for making electrical contact is a flexible film having a conductive wiring pattern formed thereon, which wiring pattern includes a first set of conductive pads formed thereon extending above a surface of the film in a pattern corresponding to the terminal pattern on the IC device, which pads are joined to a second set of conductive pads spaced from the first set of pads. The flexible film is supported by an elastomeric support or block having a size and shape to support the first set of conductive pads. The second set of pads, joined to the first set by traces formed on the film, are disposed to contact a board or a plurality of contacts positioned on the base in an array corresponding to the pattern of the second set of pads. An alignment member, supported by the base, positions the elastomeric support and the flexible film on the base with the second set of pads also aligned for engagement with the contacts or the board, and with the first set of pads positioned in a predetermined position on the base and support block. The alignment means will also provide percise alignment of the carrier.

The members interconnecting the cover and the base comprises a pair of springs supported by and mounted along opposite edges of the base for movement from a retracted position to an engaged position wherein the springs engage the carrier to urge the same against the means for making the electrical contact to the external circuit. Additionally, cam followers and cams provide means engagable with the springs for urging the springs to the retracted position separated from the carrier upon movement of the cover toward the base.

DESCRIPTION OF THE DRAWING

The present invention will be explained in greater detail with reference to the accompanying drawing wherein.

DETAILED DESCRIPTION OF THE PRESENTLY PREFERRED INVENTION

The present invention will be described with reference to the drawing, wherein like reference numerals refer to like parts throughout the several views.

Figure 1:
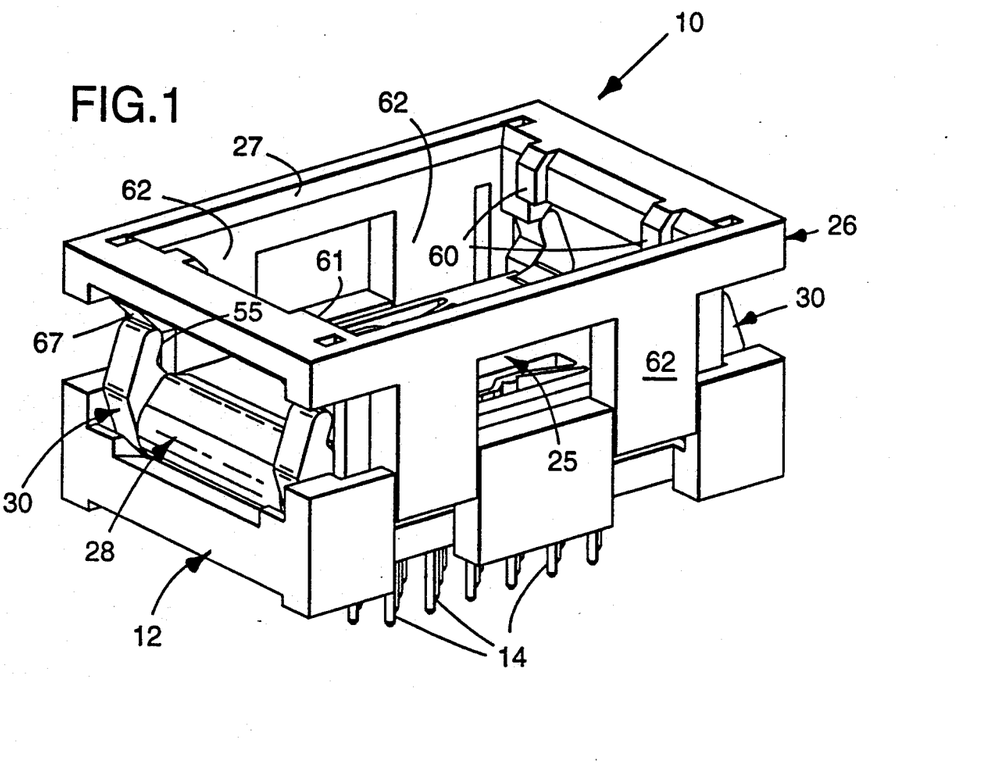
FIG. 1 is a perspective view of the socket assembly of the present invention.

The socket assembly 10 of the present invention comprises a top loading socket adapted for the automatic insertion and removal of IC die or device 18 carried by a carrier member 25 into a test and burn-in circuit. In FIG. 1 there is illustrated the socket assembly 10 according to the present invention which is adapted to be readily connected to a circuit board or other electronic device, not shown. The assembly 10 comprises a support or base 12, which supports means for making electrical contact between the IC device 18 and an external member such as a printed circuit board or test circuit. The electrical contact is provided by a plurality of contacts 14, illustrated as having conventional pins for insertion into via holes of a printed circuit board, for making electrical contact to another electronic device such as a printed board, not shown, a flexible film 16 having a conductive wiring pattern formed thereon, which wiring pattern includes a first set of conductive pads formed thereon extending above a surface of the film 16 in a pattern, generally centrally located on the film, corresponding to the terminal pattern on an IC device 18, which first set of pads are electrically joined to a second set of conductive pads spaced from the firs set of pads. The flexible film 16 is supported by a elastomeric support block 20 having a size and shape to support the first set of conductive pads. An alignment member or members 22, supported by the base 12 positions the elastomeric support 20 and the flexible film 16 on the bas 12 and flanges on the alignment members 22 hold the second set of pads in engagement with the contacts 14, and hold the first set of pads positioned in a predetermined position on the base and elastomeric support.

A carrier 25, adapted to be received on the base 12, supports the IC device 18 such that the device will be positioned in opposed relationship to the first set of pads when the carrier is on the base. A cover 26, positioned generally parallel to and slidable supported on the base 12, has a central opening 27 to receive and align the carrier 25 and IC device 18 with the base 12. Members interconnected between the cover and the base afford means for engaging the carrier 25 to force the carrier 25 and an IC device 18 against the film 16 to place the terminals of the device in electrical contact with the first set of pads, when the cover 26 is positioned away from the base 12, and for disengaging the carrier 25 and device 18 from the film 16 when the cover 26 is moved toward and positioned adjacent to the base 12.

The members interconnecting the cover 26 and the base 12 comprise a pair of springs 28 supported by and mounted along opposite edges of the base 12 for movement against the resilience of the springs from a retracted position to an engaged position wherein the springs 28 engage the carrier 25 to urge the same against the film 16 and elastomeric support 20. Additionally, cam followers 30 and cams provide means engagable with the springs 28 for urging the portion of the springs engaging the carrier to the retracted position separated from the carrier 25 upon movement of the cover 26 toward the base 12 under the force being applied to the upper surface of the cover 26.

Figure 2:
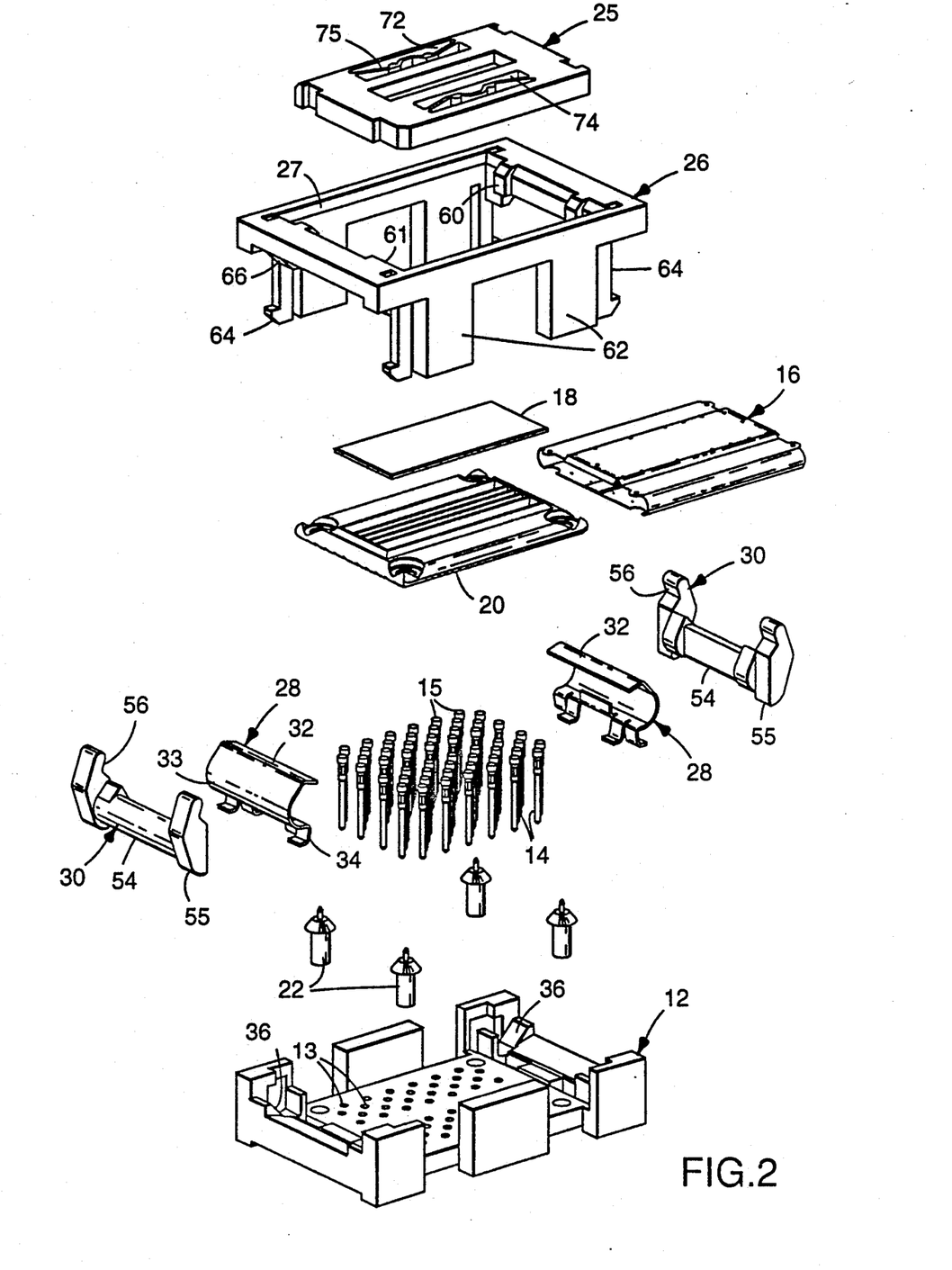
FIG. 2 is an exploded perspective view of the socket assembly showing the individual parts.
Figure 3:
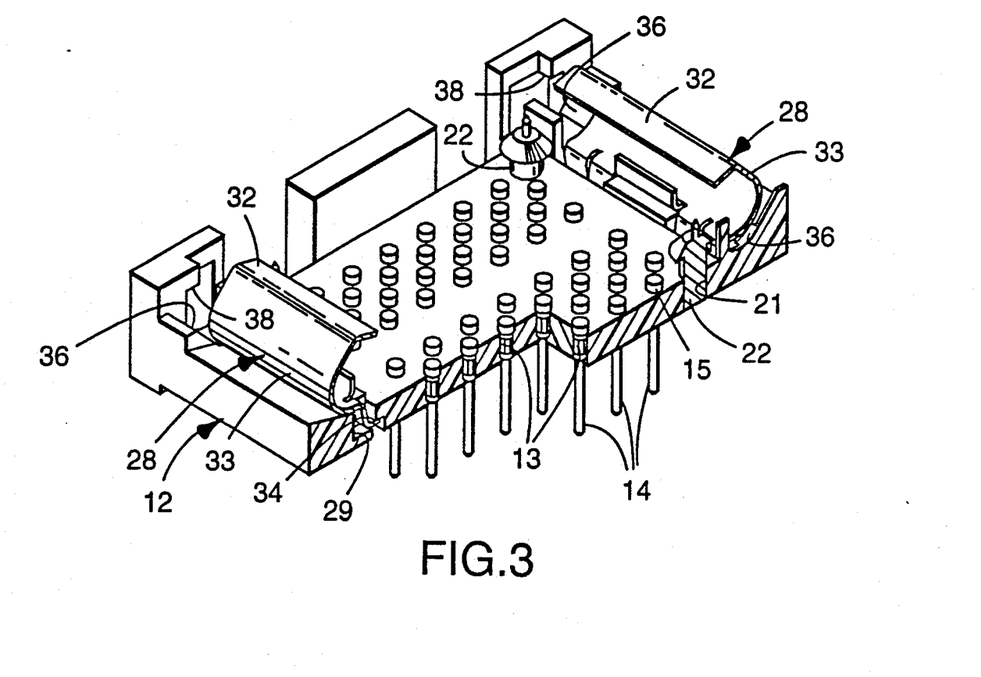
FIG. 3 is a perspective view of the support or base with the contact pins and springs mounted thereon.

In the illustrated embodiment, the base 12, see FIG. 3, is a molded part having a plate portion formed with a plurality of holes 13, in a defined pattern for receiving the contacts 14. Each of the contacts 14 is frictionally received in a hole 13 and has a head 15 to afford electrical contact with a pad of the second set of pads on the flexible film 16. At the corners of the plate portion are four larger openings 21 to receive the alignment pins 22. At opposite edges of the plate portion, or at the ends thereof as illustrated in FIG. 3, are slotted apertures or grooves 29, positioned on opposite ends of center abutments 31, for receiving the legs of the springs 28. As illustrated in FIG. 2 and 3, the spring members 28 are formed from sheet spring stock and have a first flattened generally planar portion 32, a curved portion 33, having a compound curvature, terminating in spaced leg members 34 diverging in opposite directions from the edge of the curved portion. The legs terminate in feet portions pointing in opposite directions. The legs and feet can be urged toward each other, in a manner such that the legs are parallel, and fitted in the grooves 29. When placed in the grooves from the upper side of the base as shown in FIG. 3, the legs are released and the feet expand under ledges or shoulders formed on opposite sides of the grooves 29, as shown in FIG. 3. Bent from the spring material, of each spring, in the direction opposite the direction of the leg members and toward the planar portion 32 is a tab 35 which is positioned above the abutment 31. The tabs 35 help to retain the cam members in place as will be described. The base 12 is further provided with cradles 36 adjacent to each end of the grooves 29 to receive the cam follower members 30. Further, the base 12 is provided with vertically positioned recesses in the side walls for receiving guide members of the cover and with recessed areas defining a ledge 38 to receive locking members formed with a hook on the ends for securing the cover 26 to the base 12, as will be hereinafter described.

Figures 4, 4A:
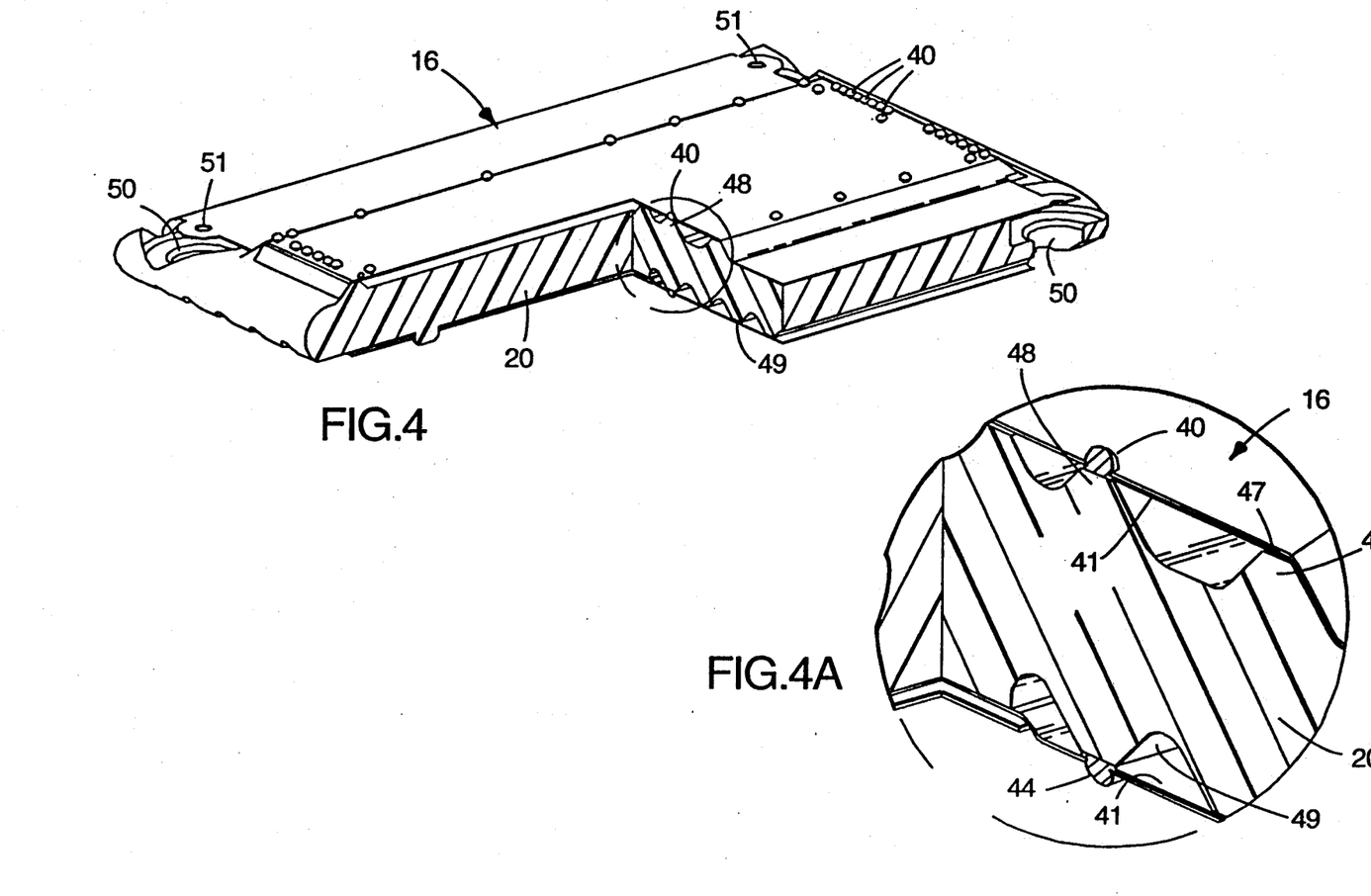
FIG. 4 is a perspective view of the flexible film and the elastomeric support member in assembled relationship and FIG. 4A is an enlarged detail sectional view of the area illustrated in FIG. 4.

The flexible film 16, see FIGS. 4 and 4A comprises a length of film including a substrate having a conductive wiring pattern formed thereon by metal paths on at least one surface joined electrically to bumps formed on a surface thereof for connection to pads on the IC device. The flexible film 16 is a polyimide film having a conductive metal coating on one surface. Then by etching or masking processes which are known in the art, the contact areas and circuit traces are formed on one surface of the film. The flexible film 16 has a first set of pads positioned in a definite array or pattern in the form of bumps 40 near the center of the sheet of film, in a definite pattern which as illustrated has a rectangular outline, and the bumps 40 are connected to metal circuit traces 41 on the opposite surface of the film which traces are connected to bumps 44 of a second set of pads formed in an array near one or both ends of the film 16.

The flexible film 16 is folded about the elastomeric support 20 which is formed by molding to define a pair of surfaces to provide support for the patterned bumps of the first set on pads on one side and to support the opposite side of the support is generally planar to support the second set of pads on the opposite side. One surface supporting the first set of pads is formed with ridges and grooves such that the ridges are positioned under the bumps to give them support and to raise the center portion of the film to a plane to engage the terminals of an IC device. The opposite side 49 of the support 20 is generally planar, but may be formed with ridges to support the second set of pads formed by bumps 44, see specifically FIG. 4A wherein the surface 47 is provided with the raised central portion and ridges 48 to support the bumps corresponding to the bump 40. Compression of the pad 20 does not cause a resulting displacement of the elastomer in another area which might result in a loss of compressive force between the bumps and the pads on the IC device 18 in another area. The support 20 is provided with registration holes 50. The film 16 is also provided with registration holes 51 at the edges to receive the alignment pins 22. An alternative construction, to the support 20 being a unitary block 20 with the formed pattern of raised support areas for supporting the pads, is the use of a substrate of molded polymeric material which would support separate elastomeric members on opposite surfaces to provide a resilient backing for the first set of pads on one surface of the substrate and the pads at the opposite ends of the film 16, defining the second set of pads, being supported from the opposite side of the substrate.

Figure 5:
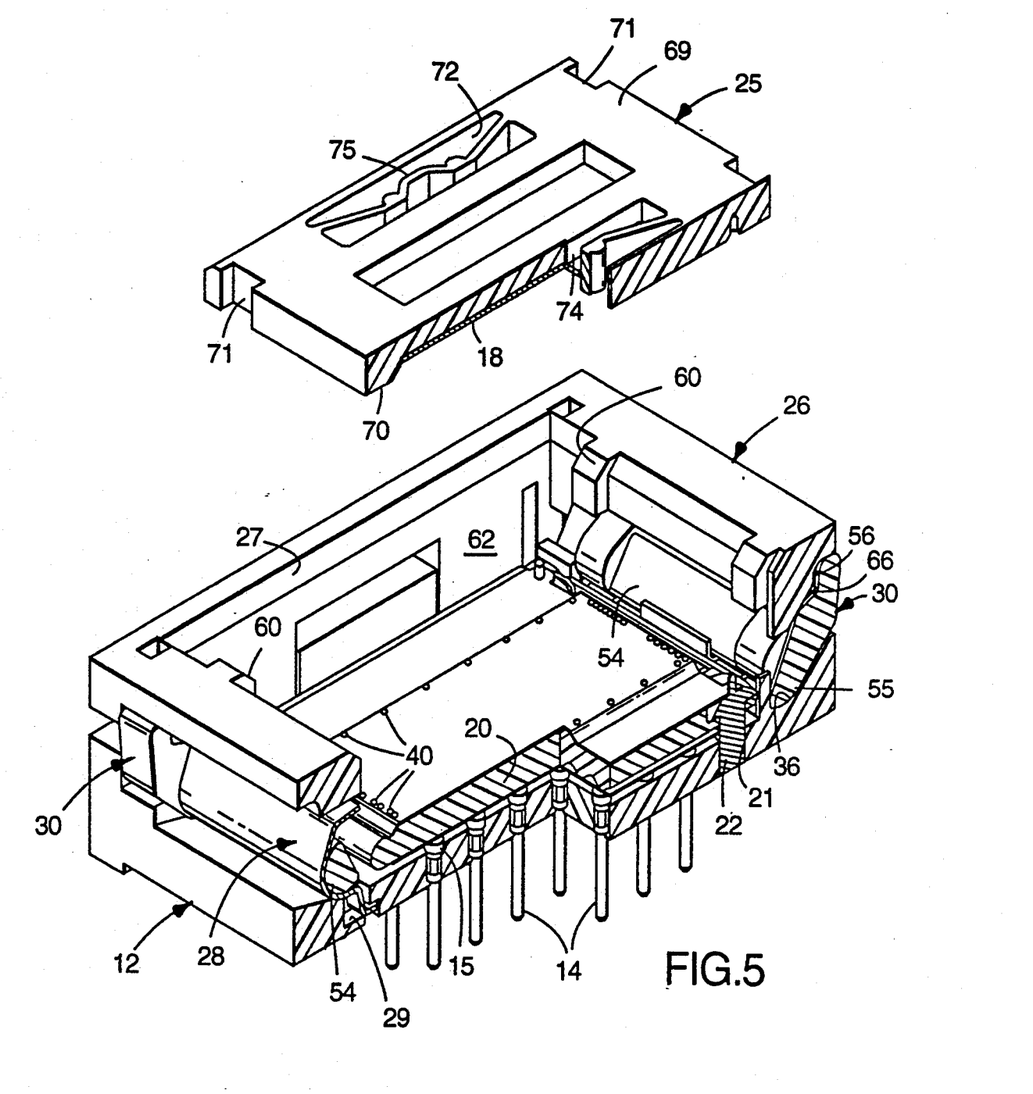
FIG. 5 is a perspective view of the socket and carrier in exploded view, with the parts partly in vertical section to illustrated the interior parts, of the socket positioned to receive the carrier.

As illustrated in FIG. 5, the support 20 and film 16 are positioned on the plate of the base 12 to position the second set of pads in alignment with the heads 15 of the contacts 14. The alignment pins 22 position the support 20 and the film 16 to afford the proper registration of the pads, heads, the elastomer and the carrier. The cam follower members 30 are inserted into the cradles 36 at opposite edges of the plate. The cam follower members 30 have a bar portion 54 having a longitudinally curved surface defining one side of the bar to engage the inner concave surface of the curved portion 33 of the springs 28 and radially extending end portions having a surface 55 mating with the cradles 36 and an extended cam engaging surface portion 56 for engaging a cam surface of the cover 26 to be described later. The cam followers 30 are supported with the springs 28 engaging the curved surface of the bar portion 54.

Figure 6:
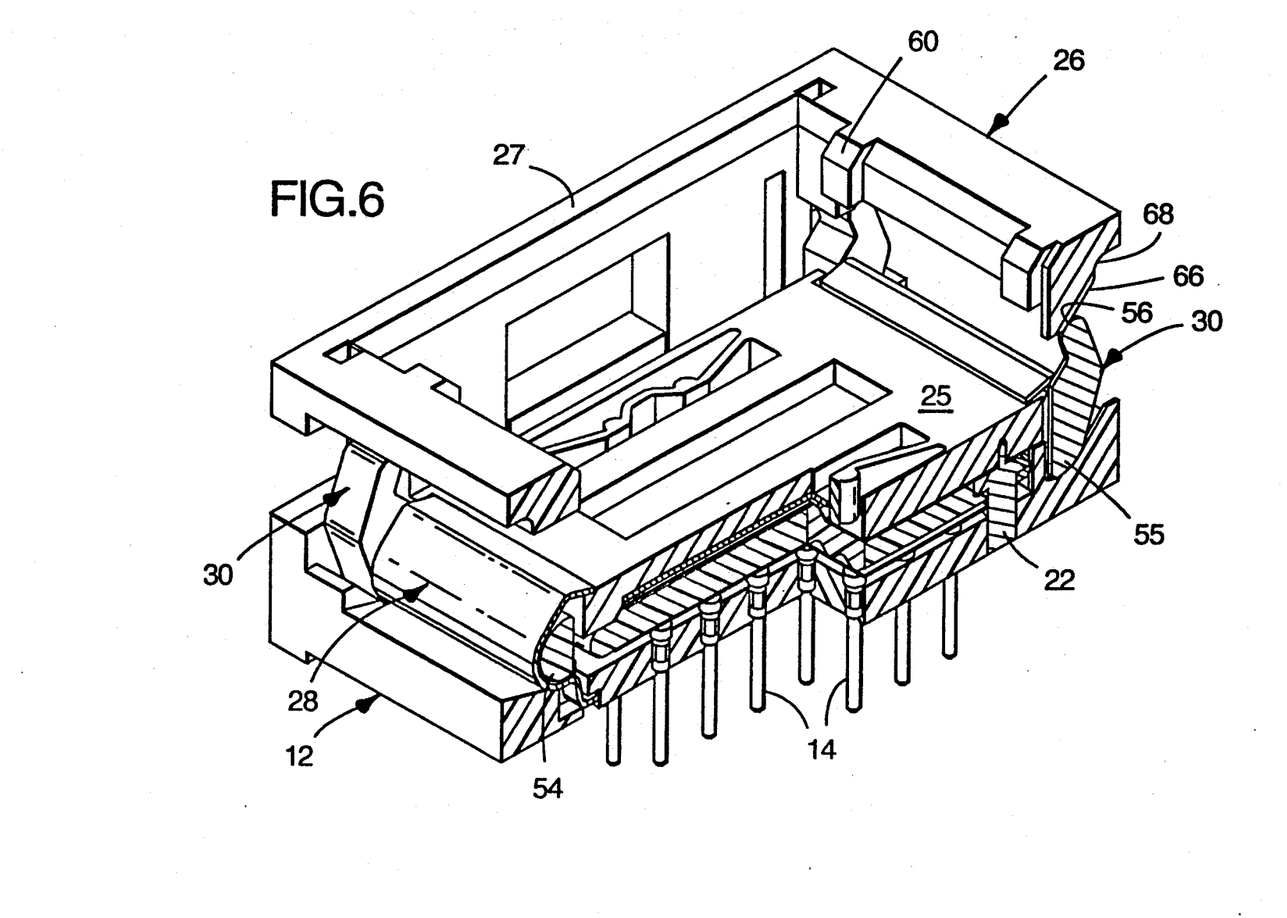
FIG. 6 is a perspective view of the socket with the carrier in place and the parts shown in vertical section to illustrate the interior parts of the socket assembly with the IC device in place and the carrier in the socket.

The cover 26, see FIGS. 5 and 6, is slidably mounted on the base for translational movement in relationship to the plate portion of the base 12. The cover 26 has the central opening 27 of a shape to receive the carrier 25, which opening is formed with beveled edges to guide the carrier into the opening 27. Positioned about the periphery of the opening are projections 60 at opposite edges to polarize the carrier 25 if needed to assure alignment of the IC device 18 if it is not symmetrical. As illustrated in FIG. 1 and 2, in the lower right hand corner, the projection 61 extends into the opening and direct to the wall to make the opening non-symmetrical. Extending downward from the cover 26 are four symmetrical standards 62 adapted to be received in the recesses in the side walls of the base 12. These standards are provided to afford the sliding movement of the cover 26 in relationship to the base 12. Adjacent to the standards, are locking members 64 formed independent of and offset inward of the standards 62, and each have a locking pawl on the free end to engage the ledge 38 formed at the corners of the base to restrict the separation of the base 12 and the cover 26. The locking members 64 are positioned to fit into the recesses in the wall members forming the corners of the base 12.

The cover 26 is also formed, at opposite ends with spaced cam surfaces 66 and 67 adjacent the corners to mate with and cooperate with the cam follower surfaces 56 of the cam followers 30. The cam surfaces 66 at one end and the surfaces 67 at the other end, serve to initially cause the cam follower members 30 to rock in the cradles 55 to drive the springs 28 in a direction to retract the portions 32 thereof from the position above the flexible film 16. After the initial retracting movement, the cam follower surfaces 56 drop from the angled surfaces 66 and 67 about a ridge to a more vertically oriented surface and the retraction force decreases indicating that the springs have been retracted, opening the socket to receive the carrier and die, as shown in FIG. 5.

Figure 7:
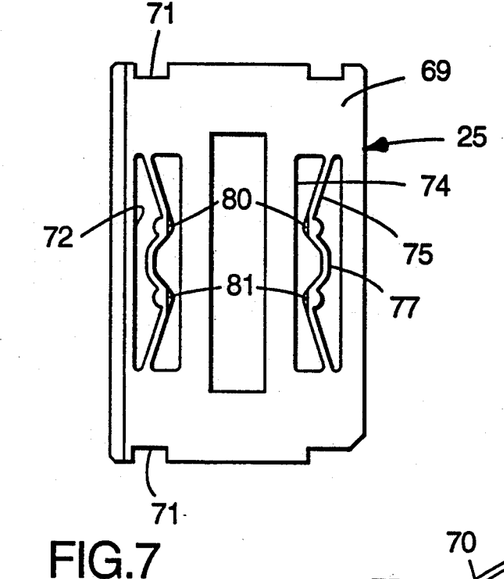
FIG. 7 is a bottom view of the carrier.
Figure 8:
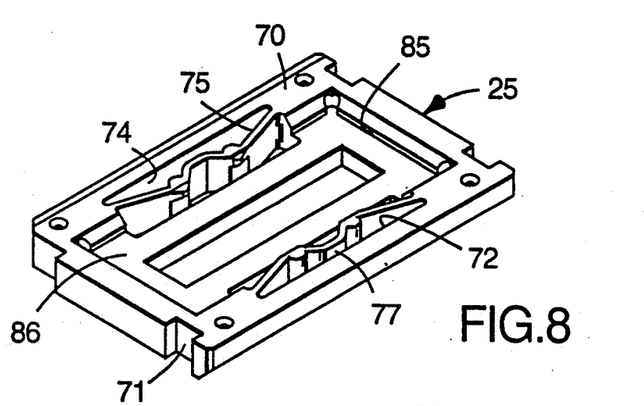
FIG. 8 is a perspective view of the carrier.
Figure 9:
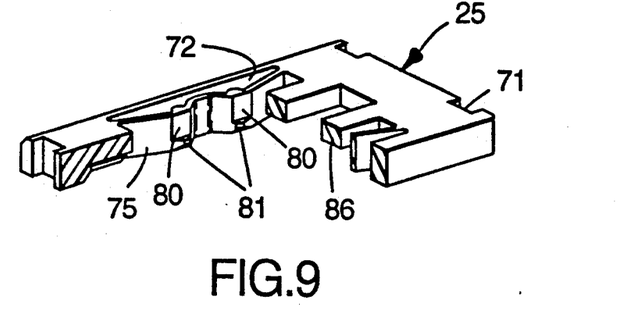
FIG. 9 is a perspective view of the carrier with portions in section to illustrate the interior portions.

The carrier 25 for the bare die 18 comprises a molded platform having opposite sides and ends and opposite surfaces 69 and 70. The ends are formed with recesses 71 to cooperate with the projections 60 and orient the carrier. Slots 72 and 74 are formed in the platform which slots extend between the surfaces 69 and 70. Resilient holding members are molded into the slots 72 and 74. The holding members are in the form of opposed or symmetrical leaf springs having points of flexure permitting the same to flex away from each other. The spring 75 in each of the slots 72 and 74 has a pair of thin converging plate-like members joined to an arcuate centrally disposed head 77 having on one face, adjacent to the areas of intersection with the plate-like members, spaced surfaces 80 disposed in a plane and outwardly extending retention nibs 81. On the surface 70 of the platform forming the carrier 25 is a rectangular recess 85, formed by beveled surfaces and straight walls of a shape to receive therein an IC device 18 such as a bare die. The rectangular recess communicates with the slots 72 and 74 to expose the surfaces 80 along the sides of the recess. An IC device 18, which when placed against the surface 86 at the bottom of the recess, will be protected and yet permit contact of the terminals with the first set of pads. The edges of the IC device will engage the surfaces 80 on the heads 77 and be positioned above the retention members 81 which hold the device in place. In the illustrated embodiment of the carrier, there is a third central slot to assist in removal of the device from the carrier and as illustrated in FIGS. 7, 8 and 9, the carrier is formed with a beveled edge on one side of the surface 69 and is formed with a recessed surface at one end to accommodate a wide projection 61 in the cover 26, see FIG. 1. The carrier 25 is also provided with openings, in the same surface that is formed with the recess 85, to accomodate the ends of the alignment pins 22 for percisely aligning the carrier and die with the first set of pads. The spring members 75, 77 could be formed to provide two separate spring members in each slot 72, 74, by separating the head, but the present construction strengthens the spring members and provides improved alignment of the IC device.

In operation, a bare die 18 is placed against the surface 86 of the carrier 25 by deflecting the spring members 75 to place the edges thereof in engagement with the surfaces 80 and then the spring members are released to hold the die 18. The cover 26 is then forced toward the base 12 and the standards slide within the recesses in the side walls of the base 12. As the cover 26 is lowered, the cam surfaces 56 of the cam followers 30 pivot the cam followers and retract the springs 28. The carrier 25 and the IC die 18 can be positioned in the cover opening 27 to a position against the flexible film and the bumps 40 thereon. The force is then released from the cover 26 and the springs 28 cause the cam follower members 30 to move the cover 26 to the spaced position and the plates 32 of the springs 28 then come into engagement with the surface 69 of the carrier 25 forcing the carrier 25 toward the film 16 and the pads thereon against the bumps 40 of the film 16. The positioning of the alignment pins causes the support 20 to press the bumps 44 forming the second set of pads on the film 16 to engage and align with the heads 15 of the contacts 14. The die is thus brought into circuit engagement for test and burn-in. Retraction of the carrier 25 and die 18 can be affected by again moveing the cover 26 toward the base to cause a retraction of the springs 28 from the carrier surface, and the carrier can be lifted from the opening 27.

Having described the present invention with respect to one embodiment, it is to be appreciated that changes can be made without departing from the spirit of the present invention as defined by the appended claims.

I claim:

1. A top-load socket for use with IC devices having a plurality of contact terminals located in a predetermined pattern adjacent a surface of said IC device, comprising:

a base, said base supporting means for making electrical contact to a printed circuit board including a first set of conductive members disposed in a pattern corresponding to the terminal pattern on a said IC device, a carrier adapted to be received on said base for supporting a said IC device such that said IC device will be positioned in opposed relationship to said first set of conductive members on said base, a cover positioned generally parallel to and slidably supported on said base, said cover having a central opening to receive and align said carrier with the base conductive members, and means interconnected between said carrier and said base foe engaging said carrier to force said carrier and sad IC device against said conductive members to place the terminals of a said IC device in electrical contact with said first set of conductive members when said cover is positioned away from said base and for disengaging said carrier from said conductive members when said cover is moved toward and positioned adjacent to said base.

2. A socket according to claim 1 wherein said cover and base are provided with means for retaining said cover on said base and said means interconnected between said cover and said base include spring means for urging said cover to a raised position.

3. A socket according to claim 1 wherein said means interconnecting said cover and said base comprises a pair of springs supported by and mounted along opposite edges of said base for movement from a retracted position to an engaged psoition wherein the springs engage said carrier to urge the same against the conductive members, and cam means engagable with said springs for urging said springs to the retracted position separated from said carrier upon movement of said cover toward said base.

4. A socket according to claim 3 wherein said cam comprises a pair of bars having ends and spring engaging cam portions on one face, and each bar having radial cam engaging cam follower arms positioned at the ends thereof, and said cover having cams formed thereon for engaging said cam followers to move said bars and said springs to the retracted position upon sliding movement of said cover toward said base.

5. A socket according to claim 1 wherein said means affording electrical contact comprises a flexible film having a conductive wiring pattern formed thereon, said wiring pattern including a first set of conductive pads formed thereon extending above a surface of said film in a pattern corresponding to the terminal pattern on a said device and joined to a second set of conductive pads spaced from said first set of pads, an elastomeric support having a size and shape to support said first set of conductive pads, said flexible film being folded about said elastomeric support, alignment means supported by said base for positioning said elastomeric support and said flexible film on said base with said second set of pads in engagement with means making contact with an external component, and with the first set of pads positioned in a predetermined position on said base and elastomeric support for making electrical engagement with the external component.

6. A socket according to claim 5 wherein said elastomeric support is formed with a patterned surface adjacent to said first set of pads to permit compression in the areas of said pads without causing a deflection in areas adjacent thereto.

7. A socket according to claim 5 wherein said second set of pads engage a set of contacts supported by said base and adapted to engage a printed circuit board, which contacts comprise a plurality of pins having heads disposed on the side of said base engaging said film and extending through holes in said base.

8. A socket according to claim 1 wherein said carrier comprises a molded platform having opposite sides and ends and opposite surfaces, slots formed in the platform which extend between the opposite surfaces, and resilient holding members, said holding members are molded into said slots for engaging a said IC device supported against one surface of the platform.

9. A socket according to claim 8 wherein said one surface of the platform is formed with a recess shaped to receive said IC device and communicating with the slots and the resilient holding members to recess said IC device but permit exposure of the pads thereon for engagement with means for making electrical contact.

10. A socket according to claim 9 wherein said carrier and said cover are formed with means to orient the carrier to said cover and base.

11. A carrier for a bare IC die comprises a molded platform having opposite sides and ends and opposite surfaces, the platform is formed with slots which extend between the opposite surfaces, one of the surfaces is formed with a rectangular recess communicating with said slots, said slots having resilient retention members therein and positioned adjacent to and communicating with said recess such that a said die placed in said recess is engaged by said retention members and retained in said recess.

12. A carrier according to claim 11 wherein said platform is provided with means for orienting said platform with another member.

13. A carrier according to claim 11 wherein said retention members are in the form of a pair of opposed leaf springs, each having spaced surfaces disposed in a plane to engage the opposite edges of a said die and nibs projecting from the surfaces to retain a said die from displacement from said surfaces when placed in said recess.

14. A carrier according to claim 13 wherein said springs are molded with said platform.

* * * * *